United States Patent
Hosono et al.

(10) Patent No.: US 7,061,014 B2
(45) Date of Patent: Jun. 13, 2006

(54) NATURAL-SUPERLATTICE HOMOLOGOUS SINGLE CRYSTAL THIN FILM, METHOD FOR PREPARATION THEREOF, AND DEVICE USING SAID SINGLE CRYSTAL THIN FILM

(75) Inventors: Hideo Hosono, Kanagawa (JP); Hiromichi Ota, Kanagawa (JP); Masahiro Orita, Chiba (JP); Kazushige Ueda, Kanagawa (JP); Masahiro Hirano, Tokyo (JP); Toshio Kamiya, Kanagawa (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/494,247

(22) PCT Filed: Oct. 31, 2002

(86) PCT No.: PCT/JP02/11404

§ 371 (c)(1),
(2), (4) Date: Oct. 21, 2004

(87) PCT Pub. No.: WO03/040441

PCT Pub. Date: May 15, 2003

(65) Prior Publication Data

US 2005/0039670 A1 Feb. 24, 2005

(30) Foreign Application Priority Data

Nov. 5, 2001 (JP) .............................. 2001-340066
Sep. 11, 2002 (JP) .............................. 2002-266012

(51) Int. Cl.
  *H01L 29/10* (2006.01)
  *H01L 29/12* (2006.01)

(52) U.S. Cl. .............................. 257/43; 257/9; 257/15; 257/16; 257/17; 257/18; 257/19; 257/20; 257/21; 257/22; 257/28

(58) Field of Classification Search .................... 257/9, 257/15–22, 28
See application file for complete search history.

(56) References Cited

U.S. PATENT DOCUMENTS 5,783,838 A * 7/1998 Kyozuka et al. .............. 257/21

(Continued)

OTHER PUBLICATIONS

Patent Abstracts of Japan; Publication No. 2002-044236, dated Feb. 8, 2002. Cited in the PCT search report.
M. Orita et al.; Philosophical Magazine B, vol. 81, No. 5, pp. 501-515, 2001. Discussed in the specification.

(Continued)

*Primary Examiner*—Ida M. Soward
(74) *Attorney, Agent, or Firm*—Weterman, Hattori, Daniels & Adrian, LLP.

(57) ABSTRACT

Disclosed is a natural-superlattice homologous single-crystal thin film, which includes a complex oxide which is epitaxially grown on either one of a ZnO epitaxial thin film formed on a single-crystal substrate, the single-crystal substrate after disappearance of the ZnO epitaxial thin film and a ZnO single crystal. The complex oxide is expressed by the formula: $M^1 M^2 O_3 (ZnO)_m$, wherein $M^1$ is at least one selected from the group consisting of Ga, Fe, Sc, In, Lu, Yb, Tm, Er, Ho and Y, $M^2$ is at least one selected from the group consisting of Mn, Fe, Ga, In and Al, and m is a natural number of 1 or more. A natural-superlattice homologous single-crystal thin film formed by depositing the complex oxide and subjecting the obtained layered film to a thermal anneal treatment can be used in optimal devices, electronic devices and X-ray optical devices.

12 Claims, 5 Drawing Sheets

1: YSZ Substrate
2: InGaO₃ (ZnO)₅ Thin Film
3: Gate Insulation Film
4: Gate Electrode
5: Source Electrode
6: Drain Electrode

U.S. PATENT DOCUMENTS

| | | | |
|---|---|---|---|
| 5,831,277 A * | 11/1998 | Razeghi | 257/15 |
| 5,889,295 A * | 3/1999 | Rennie et al. | 257/96 |
| 6,337,493 B1 * | 1/2002 | Tanizawa et al. | 257/79 |
| 6,356,572 B1 * | 3/2002 | Tanaka et al. | 372/45.01 |
| 6,407,405 B1 * | 6/2002 | Sano et al. | 257/15 |
| 6,420,197 B1 * | 7/2002 | Ishida et al. | 438/22 |
| 6,570,187 B1 * | 5/2003 | Pautrat et al. | 257/79 |
| 6,806,503 B1 * | 10/2004 | Hosono et al. | 257/79 |
| 6,878,962 B1 * | 4/2005 | Kawasaki et al. | 257/43 |
| 2002/0117661 A1 * | 8/2002 | Kondo et al. | 257/21 |

OTHER PUBLICATIONS

M. Nakamura et al.; Journal of Solid State Chemistry, vol. 86, pp. 16-40, 1990. Discussed in the specification.

M. Isobe et al.; Acta Cryst. C50, pp. 332-336, 1994. Discussed in the specification.

C. Li et al.; Journal of Solid State Chemistry, vol. 139, pp. 347-355. 1998. Discussed in the specification.

H. Hiramatsu et al.; Chem. Matter, vol. 10, No. 10, pp. 3033-3039, 1998. Discussed in the specification.

* cited by examiner

1: YSZ Substrate
2: InGaO$_3$ (ZnO)$_5$ Thin Film
3: Gate Insulation Film
4: Gate Electrode
5: Source Electrode
6: Drain Electrode

NATURAL-SUPERLATTICE HOMOLOGOUS SINGLE CRYSTAL THIN FILM, METHOD FOR PREPARATION THEREOF, AND DEVICE USING SAID SINGLE CRYSTAL THIN FILM

TECHNICAL FIELD

The present invention relates to a ZnO-based complex-oxide epitaxial single-crystal thin film having a natural superlattice structure, a production method of the single-crystal thin film, and a device, such as optical devices, electronic devices and X-ray optical devices, using the single-crystal thin film.

BACKGROUND ART

The term "superlattice" generically means a structure formed by orderly superimposing a number of ultra-thin crystal layers consisting of different materials. The superlattice includes a "natural superlattice" based on periodicity in material's own crystal structure, and an "artificial superlattice" artificially created by alternately laminating ultra-thin films of different compositions. In case where the crystalline period or the thickness of each of the thin-film layers is in the nanometer range, periodic crystal layers or thin-film layers different in chemical composition and/or layer thickness can be variously combined to obtain specific characteristics different from the properties of a mixed crystal formed by combining layers consisting of the same material or by combining uniform layers. These specific characteristics mostly arise from the quantum size effect.

As to the natural superlattice, there has been known a crystal with long period phases, such as homologous crystal phases. With regard to the artificial superlattice, in 1969, Reona Ezaki proposed the concept of "semiconductor superlattice" or an artificial single crystal having one-dimensional periodical structural changes. Specifically, it was suggested that a negative-resistance property can be achieved using a semiconductor superlattice structure formed by alternately laminating a small-bandgap thin-film layer (well layer) and a large-bandgap thin-film layer (barrier layer), which have a film thickness of several nanometers.

The quantum effect in a superlattice structure can be obtained only if each of the above thin films has a thickness of about 5 nm or less, which is less than the de Broglie wavelength of an electron. If each of the thin films has a thickness greater than this value, their semiconductive properties will be maintained as-is, or the interface between the thin films will merely act as a pure boundary condition. Whereas, when the film thickness becomes less than the de Broglie wavelength, electrons start behaving like waves to create new properties. This effect is generally referred to as "quantum size effect".

In the superlattice structure, electrons residing in the well layer are in a condition sensitive to a well-type potential created between two barrier layers. This well structure is referred to as "quantum well", and an electron in the quantum well can only have specific discrete energy levels because they have wave-like properties. Electrons having the same energy as the discrete quantum energy level can pass through the barrier layers to intrude into the quantum well. This phenomenon is referred to as "resonant tunneling effect".

Electronic optical properties peculiar to a semiconductor crystal are based on a structure in which atoms are orderly arranged on a crystal lattice to induce a periodic potential to electrons. In addition to this crystalline periodic potential, a semiconductor superlattice has a long-periodic potential based on its superlattice structure. The movement of electrons under the synergistic action of the two potentials is believed to allow the superlattice to have new properties different from bulk crystals.

Through the above mechanism, the superlattice structure exhibits characteristics of higher electron drift velocity, increased tunnel current based on the resonant tunneling effect, and enhanced luminescence efficiency based on the coupling between an electron and a hole. By taking advantage of these characteristics, a superlattice structure using a compound semiconductor material has already been put to practical use as devices including a high electron mobility transistor (HEMT) and semiconductor lasers for a communications or optical-disk. It is also known that the resonant tunneling effect can be utilized to obtain a specific current-voltage characteristic having negative differential-resistance. A typical example utilizing the negative differential-resistance is a monostable-bistable transition logic element (MOBILE).

A field-effect transistor (FET) is an electronic device currently having the widest range of practical applications, such as unitary electronic elements of a semiconductor memory integrated circuit, high-frequency signal amplifying devices and liquid-crystal driving devices. HEMET is one type of FETs, which uses a superlattice structure as an electron drift layer. In FETs, a silicon semiconductor compound is most widely used as their material in general. Specifically, a silicon single crystal is used for elements requiring high-speed operation, such as high-frequency signal amplifying devices or integrated circuit elements. However, silicon cannot be used as the material of an ultra high-speed operation device or ultra high-frequency amplifying device, such as HEMT utilizing the quantum effect, because any superlattice structure suitable for silicon has not been developed. As to liquid-crystal driving devices capable of sufficiently functioning even in low-speed operation, amorphous silicon is used therefore in view of the need for larger-area plat-panel displays.

The artificial superlattice structure is prepared by epitaxially growth of two or more different semiconductors layers through various thin-film growth technologies. The term "epitaxial growth" means that, in the state after a single-crystal thin film is grown on a single-crystal substrate, the respective crystal orientations of the thin film and the substrate are matched with one another. The epitaxial growth can provide substrate/thin-film and thin-film/thin-film interfaces which are abrupt, and low in defect density.

A typical epitaxial thin-film growth technology includes a sputtering, a molecular beam epitaxy (MBE) and a chemical vapor deposition. A sputtering process using thermal non-equilibrium vaporization is currently the most common technology, which is also industrially used. A sputtering process for use in a film forming method utilizes a so-called sputtering-phenomenon of materials by high energy particles.

The sputtering phenomenon was discovered by W. Grove in 1852. The sputtering phenomenon means that high-kinetic energy particles emitted onto the surface of a target (ions or atoms neutralized by electrons around the target surface) give the kinetic momentum of the particles to constitutive atoms of the target through elastic collision, and the recoil atoms are finally released from the target surface after repeatedly colliding with adjacent atoms. The film forming method based on the sputtering process is intended to deposit the released constitutive atoms of the target on a substrate so as to form a thin film. Generally, the sputtering process is not suitable for the preparation of an artificial superlattice, because it has a relatively high film-deposition speed. The molecular beam epitaxy (MBE) process is a thin-film crystal growth technology named in 1968 by J. R. Arthur who was in Bell Laboratories at the time, and developed for compound semiconductors, primarily GaAs. The MBE process can be considered as an improved or progressive type of a vacuum deposition process. Specifically, the MBE process is intended to perform an epitaxial crystal growth under the conditions that the flow of neutral molecules (or atoms) serving as raw materials of a crystal to be grown, or the intensity of a molecular beam (atomic beam), is accurately controlled in ultra-high vacuum, and the neutral molecules (or atoms) are deposited onto an accurately heated substrate.

The MBE process can be used for a wide range of materials including compound semiconductors, elementary semiconductors, such as Si, and various metal or oxide superconductors. The difference from the conventional vacuum deposition process is in that (i) the vacuum degree in a growth chamber is set at $10^{-7} \sim 10^{-8}$ Pa or less, (ii) the crystal growth is performed while stably maintaining the cleanness of the crystal surface at the atomic scale, and (iii) the intensity of the molecular beam (atomic beam) is accurately controlled. The MBE process is widely used in R&D and in production of commercial elements, such as HEMT.

The chemical vapor deposition (CVD) process is intended to grow a thin film having a given composition on a substrate by using chloride or organometal compound as a source material, and inducing the chemical reaction among source gases on the substrate. The CVD process having excellent compatibility to mass production is used for producing practical devices, such as a superlattice structure for semiconductor lasers.

Through a film-forming method at room temperature based on a pulsed laser deposition (PLD) process, the inventors have previously grown a homologous compound transparent thin film which contains ZnO as a primary component, such as $InGaO_3 (ZnO)_m$ (m: natural number), and exhibits n-type electrical conduction in the amorphous state (see the following Non-Patent Publication 1 and Patent Publication 1).

(Non-Patent Publication 1)
Hosono, et al. Philosophical Magazine B. 81. 501–515 (2001)
(Patent Publication 1)
Japanese Patent Laid-Open Publication. No. 2000-44236

SUMMARY OF THE INVENTION

As mentioned above, in high-speed electronic devices, such as a communications/optical-disk semiconductor laser or HEMT, a compound-semiconductor superlattice structure is used to achieve a semiconductor laser with a lowered threshold current value and/or a improved stability of oscillation wavelength, and a higher-speed HEMT. Further, a GaN/InGaN/GaN superlattice and a ZnMgO/ZnO/ZnMgO superlattice have been proposed, and partly put to practical use.

Each of the layers in a superlattice structure has an extremely thin thickness of 1 to 100 atomic layers. Thus, if one of the layers locally has irregularity in thickness even at the atomic-layer level, such irregularity will have considerable adverse affects. Thus, in the production of such a superlattice structure, it is essential to control superlattice growth in the atomic-layer level through a sophisticated film-deposition technology, such as more advanced MBE process or CVD process. From this point of view, it is expected that if a superlattice existing in the natural is positively used instead of the aforementioned artificially prepared superlattice, a superlattice structure having an accurately controlled layer thickness can be prepared while simplifying the film-deposition process.

It is also expected that a natural superlattice structure has a potential for allowing one-dimensional superlattice structure (quantum wire structure) to be formed as well as two-dimensional superlattice structure (quantum well structure), and for allowing the range of applicable chemical compositions to be extended to oxides and others.

In 1967, based on researches on the high-temperature phase of $ZnO—In_2O_3$—based compounds using X-ray diffraction (XRD) analysis, Kasper first reported the existence of rhombohedral or hexagonal oxides $In_2O_3 (ZnO)_m$ (m=2, 3, 4, 5 and 7) with a crystal structure analogous to wurtzite-type (H. Kasper, "Neuartige Phasen mit wurtzitahnlichen Strukturen im System $ZnO—In_2O_3$", Z. Anorg. Allg. Chem., 349, 113–23 (1967)).

Recently, the research group of Kimizuka et al. demonstrated that a group of homologous phases expressed by $InFeO_3 (ZnO)_m$ (m: natural number) exist in the $In_2O_3—Fe_2O_3—ZnO$ system through detailed researches on crystal phases appearing in the $R_2O_3—Fe_2O_3—M'O$ system (R: rare-earth element, M': bivalent cation element) (M. Nakamura, N. Kimizuka, and T. Mohri, "The Phase Relation in the $In_2O_3—Fe_2ZnO_4—ZnO$ System at 1350° C.", J. Solid State Chem., 86, 16–40 (1990))

The homologous phases (homologous series) are, for example, Magneli phases expressed by the composition formula $TinO_{2n-1}$ (n: natural number). Such phases include a group of compounds expressed by a composition formula with a continuously changing n. M. Isobe et al. achieved to analyze the single crystal structure of $LuFeO_3 (ZnO)_m$ (M. Isobe, N. Kimizuka, M. Nakamura, and T. Mohri, "Structures of $LuFeO_3 (ZnO)_m$ (m=1, 4, 5 and 6)", Acta Cryst. C50, 332–336 (1994)).

They reported that the single crystal structure of $LuFeO_3 (ZnO)_m$ is a natural superlattice having a $LuO_{1.5}$ layer and a $FeO_{1.5} (ZnO)_m$ layer which are alternately laminated in the c-axis direction, wherein it has a rhombohedral structure when m is an odd number, and a hexagonal structure when m is an even number. That is, the value of m is the number of atomic layers of $FeO_{1.5} (ZnO)_{m'}$, and the crystal structure of $LuFeO_3 (ZnO)_m$ can be considered as a superlattice structure where the $FeO_{1.5} (ZnO)_m$ layer having an atomic layer number of m and the $LuO_{1.5}$ layer having an atomic layer number of 1 are alternately laminated.

According to a recent report (C. Li, Y. Bando, M. Nakamura, M. Onada, and N. Kimizuka, "Modulated Structures of Homologous Compounds in $MO_3 (ZnO)_m$ (M=In, Ga; m=integer) Described by Four-Dimensional Superspace Group", J. Solid State Chem. 139, 347–355 (1998)), $InGaO_3 (ZnO)_m$ has a structure where Ga atoms are orderly arranged in ZnO when m>7.

This group of compounds can be considered as a ZnO-based natural superlattice known as an ultraviolet-emitting material from the 1950s. In particular, it can be considered that when m>7, M' ions exist as periodic bands in the ZnO layer to allow the ZnO layer to have a one-dimensional superlattice structure (quantum wire structure).

Heretofore, a homologous-phases $M^1 M^2 O_3 (ZnO)_m$ thin film has been prepared by depositing source materials on a substrate heated at a high temperature through a sputtering process or a PLD process (H. Hiramatsu, W-S. Seo, and K.

Koumoto, "Electrical and Optical Properties of Radio-Frequency-Sputtered Thin Films of $(ZnO)_5In_2O_3$", Chem. Mater. 10, 3033–3039 (1998)).

The above thin-film growth method for growing the homologous-phases $M^1M^2O_3 (ZnO)_m$ involves difficulties in adequately controlling the composition of a thin film to be formed, and in forming a homogeneous superlattice, due to significant vaporization in ZnO having a high vapor pressure. While the above thin-film growth method can be used to prepare an alignment film for liquid-crystal displays or the like, the quantum effect expecting from a superlattice structure cannot be fully obtained due to the heterogeneous superlattice structure.

The heterogeneous superlattice also means that the chemical composition ratio of the homologous phases is deviated from the stoichiometric ratio. The deviation in the chemical composition ratio causes the occurrence of oxygen deficits in the homologous-phases and the generation of conduction carriers. Generally, it is difficult to control the density of the conduction carriers caused by the oxygen deficits. In this connection, in the production of electronic devices, such as normally-off type field-effect transistors, it is essential to reduce the density of the conduction carriers, typically, to the intrinsic level or less ($<10^{14}$ cm$^{-3}$).

The homologous-phases $M^1M^2O_3 (ZnO)_m$ thin film and ZnO thin film are transparent to visible light. On the other hand, while FETs using a compound semiconductor, such as silicon or GaAs, have a sufficient performance for various purposes, they are opaque to visible light due to the optical characteristics of their materials, and therefore cannot serve as a transparent circuit.

In addition, the irradiation of visible light generates conduction carriers. Thus, the irradiation of high-intensity light will cause the deterioration in characteristics of the transistor. For example, in case where the FET is applied as a liquid-crystal-switching device for a liquid-crystal display, the pixels of the display has a relatively small open area ratio due to the opacity of the device to visible light. Further, if the FET is irradiated with backlight illumination, a photo-induced current will be generated therein to cause the degradation of the switching characteristic. Thus, in order to prevent such degradation, it is necessary to provide a light-shielding film for blocking the backlight illumination.

In principle, the homologous-phases $M^1M^2O_3 (ZnO)_m$ or ZnO material having a large energy bandwidth can be used in place of the silicon or compound semiconductor to solve the above problems in the silicon and compound semiconductor field-effect transistors.

Actually, it has been attempted to prepare a transparent field-effect transistor using ZnO as a transparent oxide semiconductor (see, for example, Nanakusa et al. "Journal of the Japan Society of Applied Physics, 2000 Spring Meeting, 2000. 3, p29-YL-16). However, ZnO has difficulties in reducing electrical conductivity, and thereby normally-off type field-effect transistors cannot be obtained using ZnO.

In view of these problems, the present invention is directed to diffuse an element, such as Lu or Ga, into a ZnO single crystal or a ZnO epitaxial thin film serving as a base material so as to prepare a homologous $M^1M^2O_3 (ZnO)_m$ thin film phase, and then grow a single-crystal film from the thin film phase.

Specifically, according to a first aspect of the present invention, there is provided a natural-superlattice homologous single-crystal thin film comprising a complex oxide which is epitaxially grown on a ZnO epitaxial thin film. The complex oxide is expressed by the following formula: $M^1M^2O_3 (ZnO)_m$ (wherein: $M^1$ is at least one selected from the group consisting of Ga, Fe, Sc, In, Lu, Yb, Tm, Er, Ho and Y; $M^2$ is at least one selected from the group consisting of Mn, Fe, Ga, In and Al; and m is a natural number of 1 or more).

According to a second aspect of the present invention, there is provided a natural-superlattice homologous single-crystal thin film comprising a complex oxide which is epitaxially grown on a ZnO epitaxial thin film. The ZnO epitaxial thin film is grown on a single-crystal substrate in advance of the growth of the complex oxide, and vanished during the growth of the complex oxide to allow the epitaxially grown complex oxide to reside directly on the single-crystal substrate. The complex oxide is expressed by the following formula: $M^1M^2O_3 (ZnO)_m$ (wherein: $M^1$ is at least one selected from the group consisting of Ga, Fe, Sc, In, Lu, Yb, Tm, Er, Ho and Y; $M^2$ is at least one selected from the group consisting of Mn, Fe, Ga, In and Al; and m is a natural number of 1 or more).

According to a third aspect of the present invention, there is provided a natural-superlattice homologous single-crystal thin film comprising a complex oxide which is epitaxially grown on a ZnO single crystal. The complex oxide is expressed by the following formula: $M^1M^2O_3 (ZnO)_m$ (wherein: $M^1$ is at least one selected from the group consisting of Ga, Fe, Sc, In, Lu, Yb, Tm, Er, Ho and Y; $M^2$ is at least one selected from the group consisting of Mn, Fe, Ga, In and Al; and m is a natural number of 1 or more).

In the homologous single-crystal thin film set forth in either one of the first to third aspects of the present invention, the difference of the m in the thickness direction of the thin film may be±1 or less.

Further, the m may be continuously changed in the thickness direction of the thin film.

The homologous single-crystal thin film set forth in either one of the first to third aspects of the present invention may include a surface region which has atomic level smoothness and an area of 0.5 μm×0.5 μm.

According to a fourth aspect of the present invention, there is provided a method of producing a natural-superlattice homologous single-crystal thin film. This method comprises depositing on either one of a ZnO single crystal and a ZnO epitaxial thin film, an epitaxially grown complex oxide thin film expressed by the formula $M^1M^2O_3 (ZnO)_n$ (wherein: $M^1$ is at least one selected from the group consisting of Ga, Fe, Sc, In, Lu, Yb, Tm, Er, Ho and Y; $M^2$ is at least one selected from the group consisting of Mn, Fe, Ga, In and Al; and n is a natural number of 1 or more), and subjecting the deposited film to a thermal anneal treatment.

In the method set forth in the fourth aspect of the present invention, the thermal anneal treatment may be performed while covering the deposited film with a high-melting-point compound to prevent the vaporization of ZnO component from the deposited film.

The thermal anneal treatment may also be performed under the presence of ZnO vapor to prevent the vaporization of ZnO component from the deposited film.

According to a fifth aspect of the present invention, there is provided an optical device, an X-ray optical device or an electronic device, which comprises the homologous single-crystal thin film set forth in either one of the first to third aspects of the present invention.

According to a sixth aspect of the present invention, there is provided a transparent-thin-film field-effect transistor comprising an active layer consisting of the homologous single-crystal thin film set forth in either one of the first to third aspects of the present invention. In this case, the $M^1M^2O_3 (ZnO)_m$ is $InMO_3 (ZnO)_m$, wherein M is at least one selected from the group consisting of In, Fe, Ga and Al, and m is an integer in the range of 1 to less than 50.

In the transparent-thin-film field-effect transistor set forth in the sixth aspect of the present invention, the homologous single-crystal thin film may be formed on a heat-resistant transparent oxide single-crystal substrate.

The homologous phases $M^1M^2O_3$ $(ZnO)_m$ single crystal thin film of the present invention is formed on a ZnO single crystal or a ZnO thin film epitaxially grown on a single-crystal substrate, such as an YSZ substrate or $Al_2O_3$ substrate In case where the single crystal thin film is formed on the ZnO epitaxial thin film, when an element, such as Lu or Ga, is diffused into the entire ZnO epitaxial thin film, the ZnO epitaxial thin film is vanished, and the homologous phases $M^1M^2O_3$ $(ZnO)_m$ single-crystal thin film is epitaxially grown directly on the single-crystal substrate.

In the obtained homologous phases $M^1M^2O_3$ $(ZnO)_m$ single-crystal thin film, the layers of the superlattice have the same thickness or the same value of m, or are continuously changed in thickness or in the value of m. The value of m or the thickness of natural superlattice can be controlled by changing the thickness of a thin film containing the element, such as Lu or Ga, or the temperature and/or time-period of the diffusion of the element, such as Lu or Ga, in the thin film. In case where the $M^1M^2O_3$ $(ZnO)_m$ is $LuGa_3$ $(ZnO)_m$, if the value of m is a natural number of 7 or more, the obtained homologous phases single-crystal thin film will have a wurtzite-type ZnO periodic nano-wire structure or quantum dot structure. Based on these structures, an ultraviolet-emitting device or a quantum electronic device can be produced in the same manner as in an artificial superlattice structure.

The obtained homologous phases single-crystal thin film has a multi-step terrace-shaped surface morphology. Each of the steps corresponds to the thickness of one of the layers of the superlattice. The terrace has a surface with smoothness at the atomic level or an atomically smooth surface. The homologous compound has a large thickness of one of two layers, and thus the grown thin film can have an atomically flat terrace having a width greater than 0.5 µm, which is greater than that of the substrate. In the homologous compound thin film having a larger value of m, the area of the atomically smooth surface can be further increased. For example, the atomically flat or smooth surface having a large area may be used as a sample tray for placing thereon a biological compound, such as DNA, to be observed using a tunneling electron microscope or a near-field optical microscope. In particular, the homologous compound having a low electrical resistance is suitable for this purpose.

The single crystal thin film of homologous compound containing ZnO as a primary component is transparent to visible light, and usable as a device constituting a transparent electronic circuit. The thin-film field-effect transistor of the present invention uses this single crystal thin film as an active layer. The homologous compound single crystal thin film can provide a new field-effect transistor having the following characteristics (1) to (3) superior to the conventional field-effect transistor using silicon.

(1) A homologous compound single crystal $InMO_3$ $(ZnO)_m$ (M=In, Fe, Ga or Al, and m=an integer in the range of 1 to less than 50) thin film includes an $InO_{1.5}$ layer defining a thin-film surface having smoothness at the atomic level. Thus, a thin-film field-effect transistor can be produced with suppressed defect in the interface between the gate and the active layer, and reduced gate leak current. The value of m in $InMO_3$ $(ZnO)_m$ is set at an integer in the range of 1 to less than 50. While the value of m can be infinitely increased in theory, an excessively large value of m will lead the wide variation of m in the film and the occurrence of oxygen defects to cause the increase in electrical conductivity of the thin film and difficulties in producing a normally-off FET.

(2) A homologous compound $InMO_3$ $(ZnO)_m$ (M=In, Fe, Ga or Al, and m=an integer in the range of 1 to less than 50) is transparent to visible light having a wavelength of 400 nm or more, because it has a bandgap energy of greater than 3.3 eV. Thus, the homologous compound $InMO_3$ $(ZnO)_m$ (M=In, Fe, Ga or Al, and m=an integer in the range of 1 to less than 50) thin film can be used to produce a thin-film field-effect transistor having a high visible-light transmittance and a reduced photo-induced current to be caused by visible light.

(3) A homologous compound $InMO_3$ $(ZnO)_m$ (M=In, Fe, Ga or Al, and m=an integer in the range of 1 to less than 50) single-crystal thin film prepared through a reactive solid-phase epitaxy process has an extremely small deviation from the stoichiometric composition, and exhibits an excellent insulation performance around room temperature. Thus, the homologous compound $InMO_3$ $(ZnO)_m$ (M=In, Fe, Ga or Al, and m=an integer in the range of 1 to less than 50) thin film can be used to produce a transparent thin-film field-effect transistor excellent in switching characteristic in a normally-off operation.

DESCRIPTION OF THE PREFERRED EMBODIMENTS

A ZnO single-crystal thin film having an atomically smooth surface is epitaxially grown on a single crystal substrate, such as an YSZ substrate or $Al_2O_3$ substrate, having an atomically smooth surface, through a MBE process, a pulsed laser deposition (PLD) process or other suitable film-forming process. If a ZnO single crystal is used, this step is unnecessary.

Then, a thin film expressed by $M^1M^2O_3$ $(ZnO)_n$ is grown on the above ZnO thin film or a ZnO single crystal, through a MBE process, a pulsed laser deposition (PLD) process or other suitable film-forming process.

In the above $M^1M^2O_3$ $(ZnO)_n$, n is a natural number of 1 or more. $M^1$ is at least one selected from the group consisting of Ga, Fe, Sc, In, Lu, Yb, Tm, Er, Ho and Y, and $M^2$ is at least one selected from the group consisting of Mn, Fe, Ga, In and Al. Each of Fe, Ga and In may be substituted for both $M^1$ and $M^2$. In this case, Fe, Ga and In forms homologous phases $Fe_2O_3$ $(ZnO)_n$, $Ga_2O_3$ $(ZnO)_n$ and $In_2O_3$ $(ZnO)_n$, respectively. The thin film obtained in this step is not essentially a single-crystal film, but may be a polycrystal or amorphous film.

In a final step, the thin film is subjected to a thermal anneal treatment at a temperature in the range of 800° C. to 1600° C. In order to prevent the release of oxygen from the thin film, the thermal anneal treatment is performed in a non-reducing atmosphere, preferably in the atmosphere. The treatment temperature is set preferably in the range of 800° C. to 1600° C., more preferably in the range of 1200° C. to 1500° C. If the temperature is less than 800° C., the composition $M^1M^2O_3$ $(ZnO)_m$ will become heterogeneous due to reduced diffusion speed. If the temperature is greater than 1600° C., the composition $M^1M^2O_3$ $(ZnO)_m$ will also become heterogeneous due to vaporization of the ZnO component.

If the ZnO component having a high vapor pressure is subjected to a thermal anneal treatment while being exposed to the atmosphere, any high-quality thin film cannot be obtained because the ZnO component is vaporized from the thin film during the thermal anneal treatment, and the composition ratio of the thin film after the treatment is significantly changed. ZnO vapor may be added to the atmosphere to prevent the vaporization of the ZnO component. Specifically, in advance of the thermal anneal treatment, a ZnO compound is added in a vessel for performing the treatment therein, at an amount capable of generating ZnO vapor corresponding to about 5% of the volume of the vessel. Preferably, the ZnO compound is in the form of powder or sintered compact. During the thermal anneal treatment at a high temperature, ZnO vapor is generated from the ZnO powder to provide increased ZnO vapor pressure in the vessel so as to prevent vaporization of the ZnO component from the thin film.

As another measure against the vaporization of the ZnO component, the a thin film of a high-melting-point compound, such as YSZ or $Al_2O_3$ plate may be placed to cover over the film, an then the thermal anneal treatment may be performed in the atmosphere. If the thin film has a vertical surface area greater than the cross-sectional surface area thereof, the vertical surface may be covered with the high-melting-point compound thin plate. More preferably, the thin film is covered with the plate, and then subjected to the thermal anneal treatment in the atmosphere containing ZnO vapor. In this case, the high-melting-point compound plate covering the surface of the thin film can prevent the ZnO powder from direct contact with the thin film.

The value of m in the $M^1M^2O_3$ $(ZnO)_m$ is a natural number of 1 or more, which is different from the value of n in the $M^1M^2O_3$ $(ZnO)_n$, and is uniquely determined by the ratio of the thickness of the ZnO thin film to the thickness of the $M^1M^2O_3$ $(ZnO)_n$ thin film, as shown in Table 1.

TABLE 1

| Ratio ($LuGaO_3$ $(ZnO)_1$ film thickness/ ZnO film thickness) | Value of m in $M^1M^2O_3$ $(ZnO)_m$ to be prepared |
| --- | --- |
| 3.30 | 2 |
| 4.65 | 3 |
| 1.10 | 4 |
| 0.83 | 5 |
| 0.66 | 6 |

| Ratio ($LuGaO_3$ $(ZnO)_7$ film thickness/ ZnO film thickness) | Value of m in $M^1M^2O_3$ $(ZnO)_m$ to be prepared |
| --- | --- |
| 9.5 | 8 |
| 4.8 | 9 |
| 3.2 | 10 |
| 2.4 | 11 |
| 1.9 | 12 |
| 1.6 | 13 |
| 1.4 | 14 |

If crystallization takes place after the composition is uniformed by the diffusion, the $M^1M^2O_3$ $(ZnO)_m$ single-crystal thin film will have a constant value of m in the thickness direction. If the composition after the anneal has a ZnO component less than that in the chemical composition specified by the value of m, the obtained single-crystal thin film will have a superlattice structure having m and m−1 which are mixed up. Otherwise, if the composition after the anneal has a ZnO component greater than that in the chemical composition specified by the value of m, the obtained single-crystal thin film will have a superlattice structure having m and m+1 which are mixed up.

If crystallization takes place under the condition that a concentration gradient of Zn ion in a direction from the ZnO film to the surface of the $M^1M^2O_3$ $(ZnO)_m$ film is caused by insufficiency in the diffusion, the obtained single-crystal thin film will have a "chirped superlattice structure" in which the layers of the superlattice are changed in thickness spatially continuously. The chirped superlattice structure can be used as a Bragg-diffraction grating capable of diffracting a wide range of wavelength.

The obtained single-crystal thin film can be considered as a superlattice structure having an $M^2O_{1.5}$·ZnO layer sandwiched by $M^1O_{1.5}$ layers, and thereby the quantum effect is created in electrons residing in the $M^2O_{1.5}$·ZnO layer. Thus, the obtained single-crystal thin film can be used as materials of an optical device, such as light-emitting diodes and semiconductor lasers, and an electronic device, such as MOBILE, HEMT and FET, as with the artificial superlattice structures. Further, as long as the thickness of the $M^2O_{1.5}$·ZnO layer in the obtained $M^1M^2O_3$ $(ZnO)_m$ thin film is 0.5 nm or more, the thickness can be controlled with an interval of 0.27 nm to allow the thin film to be used as the material of a mirror for reflecting X-ray.

A field-effect transistor according to the present invention will be described below in detail.

A heat-resistant transparent oxide single-crystal substrate, such as a YSZ (yttria-stabilized zirconia), sapphire, MgO or ZnO substrate, is used as a substrate for the above homologous compound single-crystal thin film containing ZnO as a primary component. In particular, it is preferable to use an YSZ substrate which has a lattice constant close to the homologous compound containing ZnO and causes no chemical reaction with the compound at a temperature of 1400° C. or less. Preferably, the substrate has a mean square surface roughness Rms of 1.0 nm or less. The mean square surface roughness Rms can be calculated by scanning the surface, for example its area of 1 μm², using an atom force microscope.

The oxide single-crystal substrate, such as an YSZ substrate, may be heated at 1000° C. or more in vacuum or the atmosphere to obtain an ultra-smoothed surface. A structure reflecting the crystal structure of the oxide single-crystal appears on the ultra-smoothed surface. Specifically, this structure is generally referred to as atomically flattened or smoothed structure, which has terraces each having a width of about several hundred nm and steps each having a height of about sub-nanometer. Each of the terraces is composed of atoms arrange on a plane, and is a fully smoothed surface except for a few defects existing thereon. However, in view of the entire substrate, it is not a fully smoothed surface due to the presence of the steps. When the structure is expressed by the roughness Rms based on the mean square surface roughness measurement method, it is 1.0 nm or less. The roughness Rms is calculated by scanning the surface, for example its area of 1 $\mu m^2$, using an atom force microscope.

Then, a ZnO single-crystal thin film having an atomically smooth surface is epitaxially grown on the obtained atomically smooth surface of the heat-resistant transparent oxide substrate through a MBE process, pulsed laser deposition (PLD) process or other suitable film-forming process. Subsequently, a homologous compound thin film expressed by $InMO_3 (ZnO)_m$ (M=In, Fe, Ga or Al, and m=an integer in the range of 1 to less than 50) is grown on the ZnO thin film through a MBE process, pulsed laser deposition (PLD) process or other suitable film-forming process.

The obtained thin film is not essentially a single-crystal film, but may be a polycrystal or amorphous film. In a final step, a high-melting-point compound plate, such as YSZ or $Al_2O_3$ is covered over the entire thin film, and then the thin film is subjected to a thermal anneal treatment at a high temperature of 1300° C. or more in the atmosphere containing ZnO vapor. The high-melting-point compound plate is used to cover over the thin film to prevent the contact between the after-mentioned ZnO powder and the surface of the thin film.

If ZnO vapor is not added to the atmosphere, any high-quality thin film cannot be obtained because ZnO having a high vapor pressure is vaporized from the thin film during the thermal anneal treatment, and the composition of the thin film after the treatment is significantly changed. Considering this problem, in advance of the thermal anneal treatment, ZnO is filled in a vessel at an amount capable of generating ZnO vapor corresponding to 5 volume % or more relative to a reaction chamber. Preferably, the ZnO is in the form of powder or sintered compact. During the thermal anneal treatment at a high temperature, ZnO vapor is generated from the ZnO powder to provide increased ZnO vapor pressure in the reaction chamber so as to prevent vaporization of ZnO component contained in the thin film.

If the diffusion-reaction between the $InMO_3 (ZnO)_m$ (M=In, Fe, Ga or Al, and m=an integer in the range of 1 to less than 50) thin film and the ZnO thin film is adequately carried out at an appropriately selected temperature, the obtained thin film will have a homogeneous composition $InMO_3 (ZnO)_{m'}$ (M=In, Fe, Ga or Al, and m'=an integer in the range of 1 to less than 50). The value of m' is determined by the ratio of the thickness of the ZnO thin film to the thickness of the $InMO_3 (ZnO)_m$ (M=In, Fe, Ga or Al, and m=an integer in the range of 1 to less than 50) thin film. When the thickness of the ZnO thin film is less than 5 nm, and the thickness of the $InMO_3 (ZnO)_m$ (M=In, Fe, Ga or Al, and m=an integer in the range of 1 to less than 50) thin film is greater than 100 nm, the value of m becomes equal to the value of m'.

The treatment temperature is set preferably in the range of 800° C. to 1600° C., more preferably in the range of 1200° C. to 1500° C. If the temperature is less than 800° C., the composition $InMO_3 (ZnO)_{m'}$ (M=In, Fe, Ga or Al, and m'=an integer in the range of 1 to less than 50) will become heterogeneous due to reduced diffusion speed. If the temperature is greater than 1600° C., the composition $InMO_3 (ZnO)_{m'}$ (M=In, Fe, Ga or Al, and m'=an integer in the range of 1 to less than 50) will also become heterogeneous due to vaporization of the ZnO component.

The obtained single-crystal thin film can be considered as a superlattice structure having an $MO_3 (ZnO)_{m'}$ layer sandwiched by $InO_{1.5}$ layers, and thereby the quantum effect is created in electrons residing the interface between the $MO_3 (ZnO)_{m'}$ layer and the $InO_{1.5}$ layer. Thus, the obtained single-crystal thin film can be used as the material of a high-frequency electronic device, as with the artificial superlattice structures.

A homologous single crystal thin film containing ZnO obtained through a reactive solid-phase epitaxy process has a composition close to the stoichiometric composition, and exhibits a high insulation performance of $10^8$ Ω·cm or more at room temperature. Thus, this single crystal thin film is suitable for a normally-off field-effect transistor.

Figure 5:
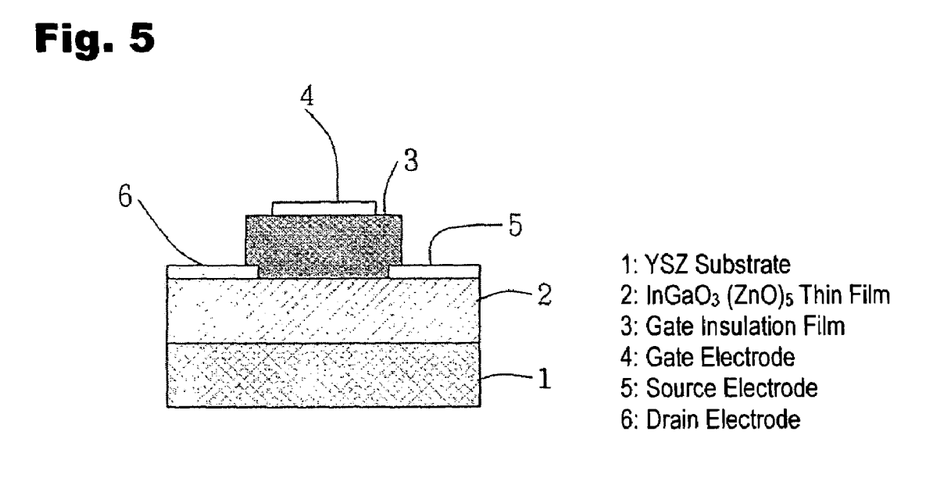
FIG. 5 is a schematic diagram showing a metal insulator field-effect transistor (MISFET) device according to one embodiment of the present invention.

The obtained homologous single-crystal thin film containing ZnO as a primary component is used as an active layer of a top-gate type metal-insulator-semiconductor (MIS) field-effect transistor. As shown in FIG. 5, a gate insulation film 3 and a metal film for a gate electrode 4 are first formed on a homologous ZnO-based single crystal thin film epitaxially grown on a substrate 1. The gate insulation film 3 is preferably made of $Al_2O_3$. The metal film for a gate electrode 4 may be made of Au, Ag, Al or Cu. Then, the gate electrode 4 is formed through an optical lithography process and a dry etch process, or a lift-off process, and a source electrode 5 and a drain electrode 6 are formed as a final step. The field-effect transistor of the present invention is not limited to the top-gate type MIS field-effect transistor (MIS-FET), but may include other type of FET, such as a junction field-effect transistor (J-FET).

EXAMPLE 1

The present invention will be described in more detail in connection with the following Examples.

1. Formation of ZnO Thin Film

A ZnO thin film was grown on a YAS (111) single-crystal substrate (10 square mm×0.5 mm t) at a substrate temperature of 800° C. Through a PLD process, a KrF (248 nm) excimer laser was irradiated to a target of ZnO sintered body in a vacuum chamber set at an oxygen pressure of $3 \times 10^{-3}$ Pa to vaporize ZnO, and the ZnO was deposited on the YAS (111) single-crystal substrate heated at 800° C., at a deposition speed of 2 nm/min for 1 hour to form the ZnO thin film. According to the analysis of the prepared ZnO thin film by means of a high-resolution X-ray diffraction (HRXRD) technique, ZnO was deposited on the YSZ (111) substrate in (0001) orientation at a tilt angle of 0.02 to 0.1 degrees. Further, through an In-plain measurement, it was verified that the ZnO was epitaxially grown adequately. The epitaxial relationship between the ZnO and the substrate was ZnO (11–20)//YSZ (1–10).

2. Formation of $LuGaO_3 (ZnO)_9$/ZnO Layered Thin Film

The ZnO thin film formed on the YSZ (111) substrate was used as a substrate to grow $LuGaO_3 (ZnO)_9$ thereon at a substrate temperature 600° C. Through a PLD process, a KrF (248 nm) excimer laser was irradiated to a target of $LuGaO_3 (ZnO)_9$ sintered body in a vacuum chamber set at an oxygen pressure of $3 \times 10^{-3}$ Pa to vaporize $LuGaO_3 (ZnO)_9$, and the $LuGaO_3 (ZnO)_9$ was deposited on the ZnO thin film formed on the YSZ (111) single-crystal substrate heated at 600° C., at a deposition speed of 2 nm/min for 30 minutes to form a LuGaO$_3$ (ZnO)$_9$ thin film. Based on the measurement of X-ray reflectance, it was proved that the LuGaO$_3$ (ZnO)$_9$ thin film had a thickness of 60 nm. The formed LuGaO$_3$ (ZnO)$_9$ thin film was composed of nano-size microcrystals, and therefore the crystallinity of the thin film could not be evaluated by an XRD measurement.

3. Formation of LuGaO$_3$ (ZnO)$_{17}$ Single Crystal Thin Film

The LuGaO$_3$ (ZnO)$_9$/ZnO/YSZ layered thin film formed in the above Section-2 was entirely covered by an YSZ single crystal (10 mm×10 mm×0.5 mm t) plate. Further, in order to prevent the vaporization of ZnO component having a high vapor pressure, about 2 g of ZnO powder (mean particle size: 1 μm) was put on the YSZ plate covering the 3 layer films. Then, the layered thin film was put into an aluminum pot of (SSA-S), and a lid of the pot was closed. Then, the layered thin film was subjected to a thermal anneal treatment at 1450° C. in the atmosphere for 30 minutes. After the completion of the thermal anneal treatment, an obtained single-crystal thin layer was cooled to room temperature in the pot.

4. Crystallinity of LuGaO$_3$ (ZnO)$_{17}$ Single Crystal Thin Film

Figure 1:
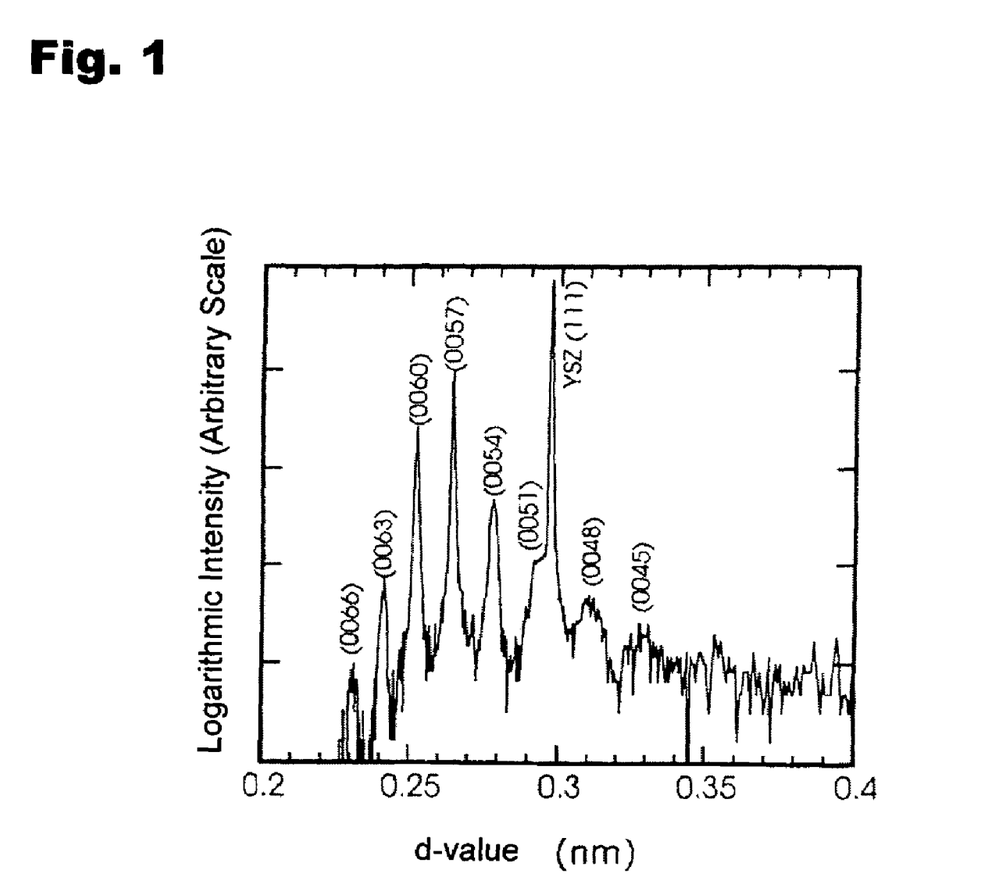
FIG. 1 is a graph of an out-of-plane XRD pattern of a homologous single-crystal thin film prepared in Example 1 showing the crystallinity.

The crystallinity of the formed single-crystal thin film was checked using a HRXRD apparatus (ATX-G, CuKa 1; available from Rigaku). FIG. 1 shows an out-of-plane XRD pattern. Strong diffraction peaks of (0001) face of LuGaO$_3$ (ZnO)$_{17}$ were observed together with a YSZ (111) peak. This shows that LuGaO$_3$ (ZnO)$_{17}$ (0001) has strongly oriented against YSZ (111). The tilt angle of LuGaO$_3$ (ZnO)$_{17}$ (0001) face was determined as 0.1 degree based on the measurement of rocking curve. Through an in-plane measurement, it was verified that the formed LuGaO$_3$ (ZnO)$_{17}$ thin film was epitaxially grown. The epitaxial relationship therebetween is as follows:

LuGaO$_3$ (ZnO)$_{17}$ (0001)//YSZ (111)

LuGaO$_3$ (ZnO)$_{17}$ (11–20)//YSZ (1–10)

5. Evaluation of Natural Superlattice

Figure 2:
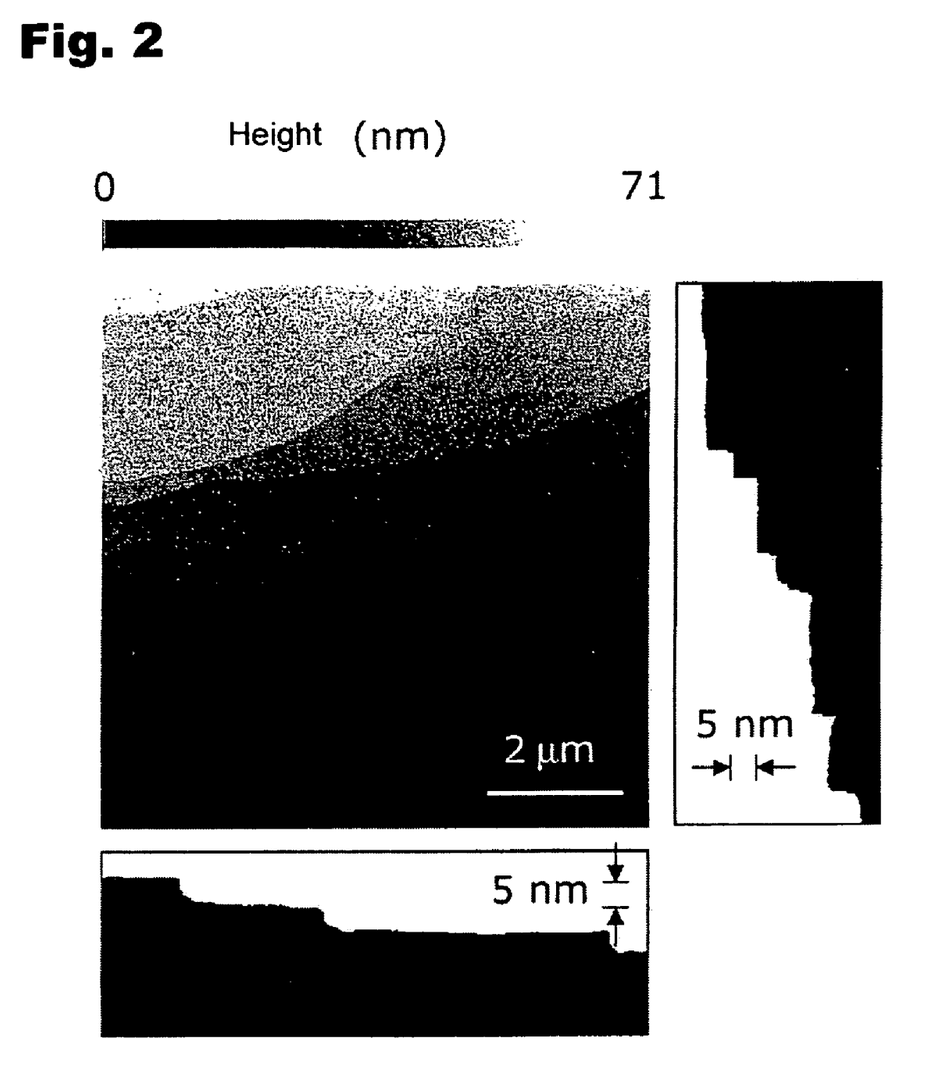
FIG. 2 is an atomic force microscopy measurement of the homologous single-crystal thin film prepared in Example 1.

The distance between adjacent LuO$_{1.5}$ layers was determined as 5 nm based on an XRD measurement of the formed LuGaO$_3$ (ZnO)$_{17}$ single-crystal thin film. Through an atomic force microscope (AFM) observation (see FIG. 2), a structure having flat terraces with atomic-level surface smoothness and steps with a height of about 5 nm was clearly observed. The smooth surface region of the atomically smooth terrace has an area of 1 μm×1 μm or more. This is one of evidences supporting that the formed LuGaO$_3$ (ZnO)$_{17}$ thin film is a single crystal.

Figure 3:
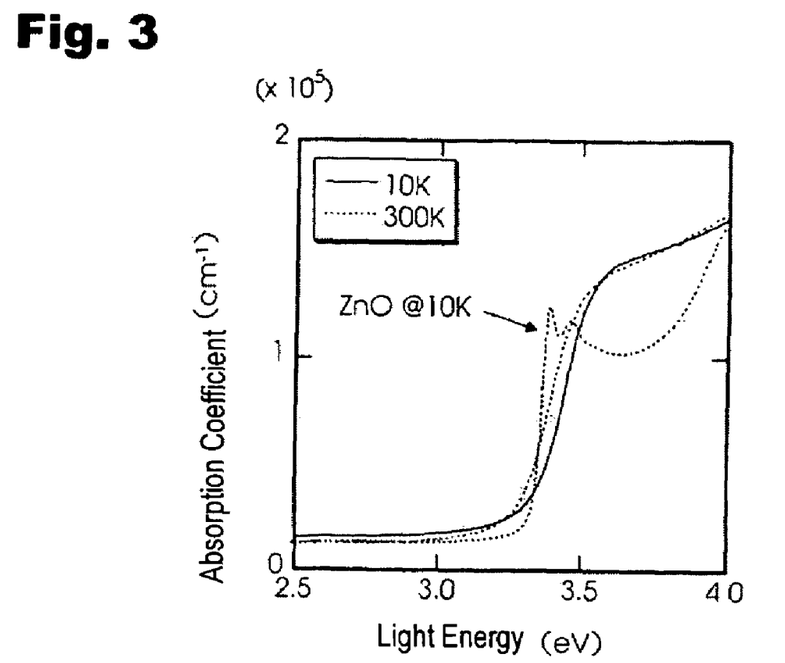
FIG. 3 is a graph showing an optical absorption spectrum of the homologous single-crystal thin film prepared in Example 1 at 10 K and 300 K.

6. Optical Absorption and Luminescent Characteristics of LuGaO$_3$ (ZnO)$_{17}$ Single-Crystal Thin Film The formed LuGaO$_3$ (ZnO)$_{17}$ single-crystal thin film was attached to a cryostat (4.2 K; available from Daikin). The interior space of the system was evacuated, and then cooled to 10 K. FIG. 3 shows optical absorption spectra at 10 K and 300 K. For comparison, an optical absorption spectrum of a ZnO epitaxial thin film is also shown in FIG. 3.

Figure 4:
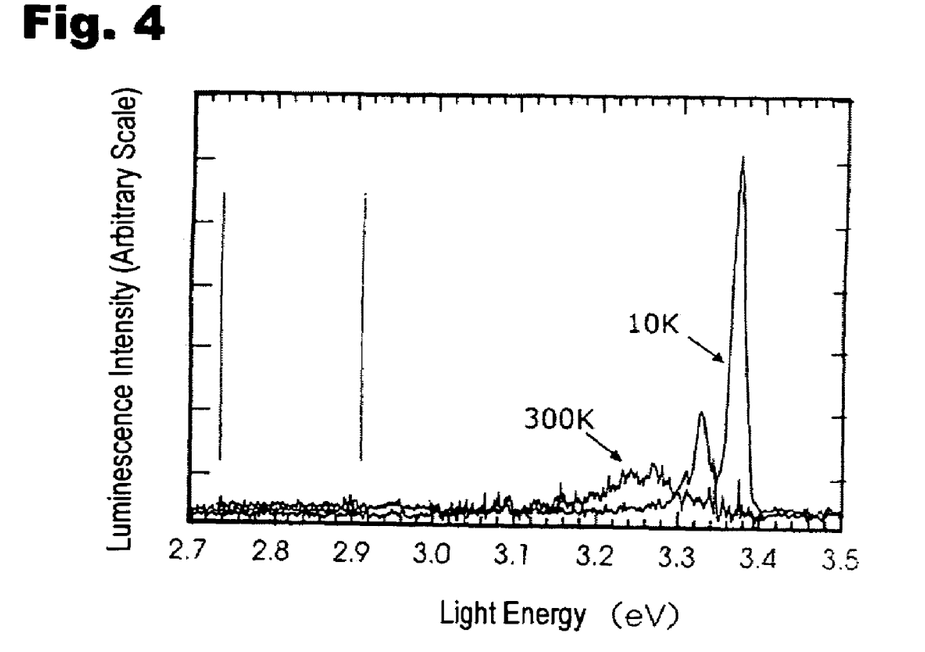
FIG. 4 is a graph showing a photoluminescence spectrum of the homologous single-crystal thin film prepared in Example 1 at 10 K and 300 K.

The Third Harmonics (wavelength: 355 nm) of neodimium doped yttrium aluminum garnet (Nd: YAG) was irradiated onto the thin film to induce the luminescence. The resulting luminescence was focused by a lens, and led to an optical fiber bundle. The output light is introduced into a spectrometer, and then detected using a charge-coupled device (CCD). FIG. 4 shows photoluminescence spectra at 10 K and 300 K.

EXAMPLE 2

In was selected as M$^1$M$^2$, and grown on the ZnO epitaxial thin film formed in the manner described in Example 1 to form an In$_2$O$_3$ thin film. Then, through a PLD process, a KrF (248 nm) excimer laser was irradiated to a target of In$_2$O$_3$ sintered body in a vacuum chamber set at an oxygen pressure of 3 ×10$^{-3}$ Pa to vaporize In$_2$O$_3$, and the In$_2$O$_3$ was deposited on the YSZ (111) single-crystal substrate heated at 600° C., at a deposition speed of 2 nm/mm for 30 minutes to form the In$_2$O$_3$ thin film. The In$_2$O$_3$ was heteroepitaxially grown on the ZnO thin film, and the epitaxial relationship therebetween was as follows:

In$_2$O$_3$ (111)//ZnO (0001)//YSZ(111)

In$_2$O$_3$ (110)//ZnO (11–20)//YSZ(1–10).

The formed bilayer thin film was subjected to a thermal anneal treatment at 1300° C. in the atmosphere for 20 minutes, in the manner as described in Example 1. As a result, the formation of an epitaxial thin film of In$_2$O$_3$ (ZnO$_3$)$_4$, In$_2$O$_3$ (ZnO$_3$)$_5$ and In$_2$O$_3$ (ZnO$_3$)$_6$ which were mixed up was confirmed through a HRXRD measurement.

COMPARATIVE EXAMPLE 1

A thin film was grown on an YSZ (111) single crystal substrate using a target of LuGaO$_3$ (ZnO)$_5$ at a substrate temperature of room temperature. The thickness of the formed thin film determined by the measurement of X-ray reflectance was 200 nm. Through an XRD measurement, it was proved that the formed thin film is amorphous. The composition of the thin film was determined through a fluorescent X-ray analysis. As a result, while the atomic ratio of Lu/Ga was 1, the atomic ratio of Zn/Lu was 3, or ZnO was reduced as compared with the composition of the target.

The formed amorphous thin film was crystallized by the annealing (1450° C., 30 minutes) described in Example 1. The formation of LuGaO$_3$ (ZnO)$_3$ (0001) was proved through a HRXRD measurement. A strong LuGaO$_3$ (ZnO)$_3$ (0001) diffraction peak was observed together with an YSZ (111) diffraction peak. Their orientation was as follows: LuGaO$_3$ (ZnO)$_3$ (0001)// YSZ (111). The tilt angle of the thin film determined through the measurement of rocking curve was about 1 degree. No in-plane orientation was observed in an in-plane measurement. Therefore, the formed thin film is a c-axis oriented LuGaO$_3$ (ZnO)$_3$ film but not a single crystal.

COMPARATIVE EXAMPLE 2

A thin film was grown on an YSZ (111) single crystal substrate through a PLD process using a target of LuGaO$_3$ (ZnO)$_9$ at a substrate temperature of 500 to 900° C. The thickness of the formed thin film determined by the measurement of X-ray reflectance was reduced as the substrate temperature was increased. The composition of the thin film was determined through a fluorescent X-ray analysis. As a result, while the atomic ratio of Lu/Ga was 1 at any growth temperature, the atomic ratio of Zn/Lu was apt to be reduced as the substrate temperature was increased.

In view of the above data, it can be concluded that the vaporization of ZnO having a high vapor pressure occurred in conjunction with the increase of the substrate temperature. In an XRD measurement for the formed thin film, any diffraction peak of homologous phases was not observed at all. Further, based on the analysis of diffraction peaks in a thin film grown at a substrate temperature of 600° C. or more, it was proved that $ZnGa_2O_4$ was undesirably formed at a high temperature.

EXAMPLE 3

1. Formation of Single Crystal $InGaO_3$ $(ZnO)_5$ Thin Crystal

A ZnO thin film having a thickness of 2 mm was epitaxially grown on a YSZ (111) single-crystal substrate through a PLD process at a substrate temperature of 700° C. Then, after the substrate temperature was reduced to room temperature, a polycrystal $InGaO_3$ $(ZnO)_5$ thin film having a thickness of 150 nm was deposited on the ZnO epitaxial thin film through a PLD process. The formed bilayer thin film was taken out to the atmosphere, and subjected to a thermal anneal treatment using an electric furnace at 1400° C. in the atmosphere for 30 minutes. After the completion of the treatment, the treated film was cooled to room temperature.

Figure 6:
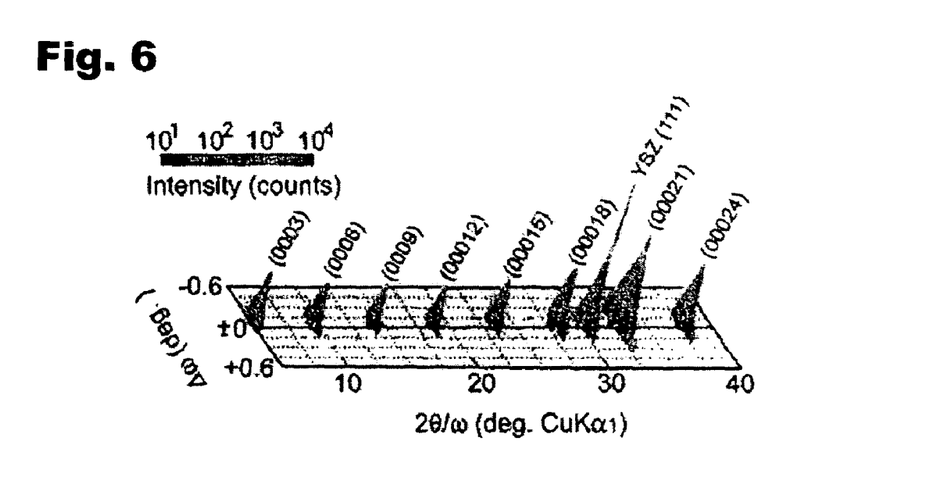
FIG. 6 is a graph showing an XRD measurement result of a single crystal $InGaO_3$ $(ZnO)_5$ thin film prepared in Example 3.
Figure 7:
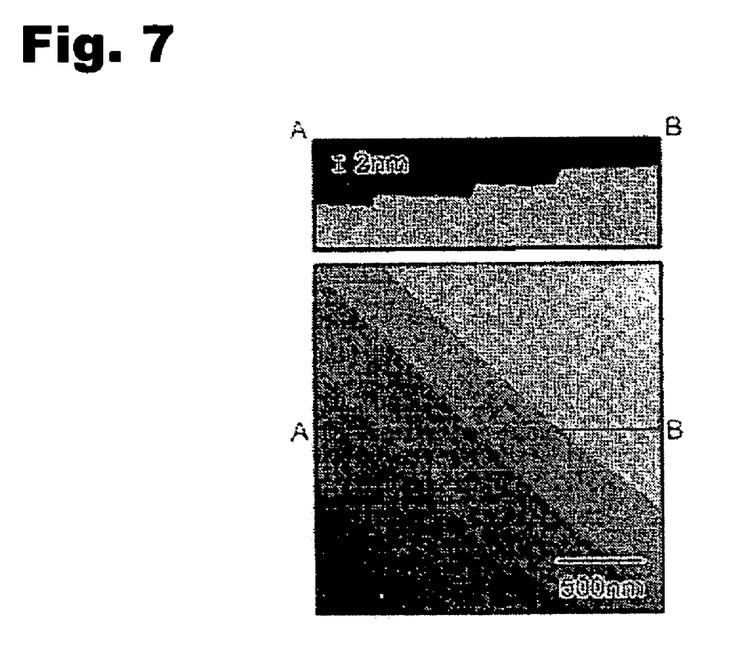
FIG. 7 is an atomic force microscopy measurement, showing the surface structure of single crystal $InGaO_3$ $(ZnO)_5$ thin film prepared in Example 3.

As the result of an XRD measurement, it was proved that the thin film subjected to the heating was a single crystal $InGaO_3$ $(ZnO)_5$ as shown in FIG. 6. Further, as the result of an AFM observation, it was proved that the surface of the thin film was an atomically smooth surface having atomically smooth terraces and steps with a height of 2 nm, as shown in FIG. 7. While it was attempted to measure the electrical conductivity of the single crystal $InGaO_3$ $(ZnO)_5$ using a DC 4-terminal method, it could not be measured due to a high insulation performance of the thin film. It can be said that the formed $InGaO_3$ $(ZnO)_5$ thin film is an insulator. The bandgap of the $InGaO_3$ $(ZnO)_5$ was calculated as about 3.3 eV based on an optical absorption spectrum measured at room temperature.

2. Formation of MISFET Element

A top-gate type MISFET device was formed through a photolithography process. Au was used as the material of source and drain electrodes and amorphous $Al_2O_3$ was used as a gate insulation film. A channel length and a channel width were 0.5 mm and 0.2 mm, respectively.

3. Evaluation of Characteristic of MISFET Element

Figure 8:
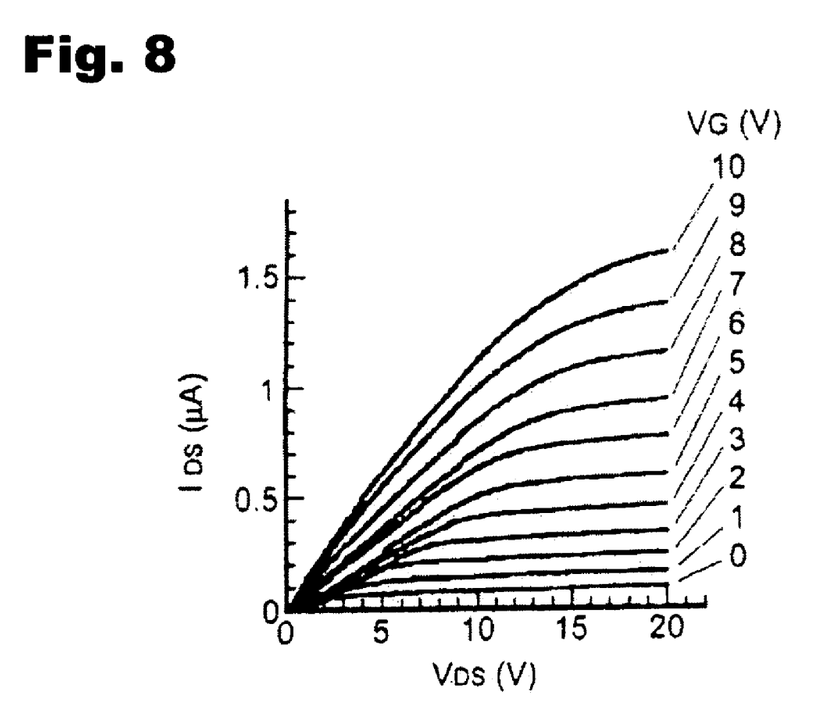
FIG. 8 is a graph showing a current-voltage characteristic of the MISFET device, which is measured at room temperature.

FIG. 8 shows a current-voltage characteristic of the MISFET measured at room temperature. When a gate voltage $V_G$ was set at 0V, $I_{DS}=10^{-8}$ A ($V_{DS}=2.0V$) was obtained. That is, a normally-off characteristic could be obtained. Further, when $V_G$ was set at 10V, a current flow of $I_{DS}=1.6\times10^{-6}$ A was created. This means that in response to a gate bias, carriers could induce in the $InGaO_3$ $(ZnO)_5$ single crystal thin film. While the same measurement was carried out using the formed device irradiated with visible light, these values were not changed. That is, no generation of photo-induced current was observed.

INDUSTRIAL APPLICABILITY

As mentioned above, the natural-superlattice homologous single-crystal thin film of the present invention can be used in an optical device (light-emitting diodes, laser diodes), an electronic device (monostable-bistable transition logic element devices utilizing a negative differential-resistance based on the resonant tunneling effect, high electron mobility transistors: HEMT, field-effect transistors: FET) and an X-ray optical device (soft X-ray reflection mirrors).

What is claimed is:

1. A natural-superlattice homologous single-crystal thin film comprising a complex oxide which is epitaxially grown on a ZnO epitaxial thin film, said complex oxide being expressed by the following formula:

$M^1M^2O_3 (ZnO)_m$, wherein $M^1$ is at least one selected from the group consisting of Ga, Fe, Sc, In, Lu, Yb, Tm, Er, Ho and Y, $M^2$ is at least one selected from the group consisting of Mn, Fe, Ga, In and Al, and m is a natural number of 1 or more and wherein said thin film has a natural-superlattice homologous single-crystal structure.

2. A natural-superlattice homologous single-crystal thin film comprising a complex oxide which is epitaxially grown on a ZnO epitaxial thin film, wherein said ZnO epitaxial thin film is grown on a single-crystal substrate in advance of the growth of said complex oxide, and vanished during the growth of said complex oxide to allow said epitaxially grown complex oxide to reside directly on said single-crystal substrate, wherein said complex oxide is expressed by the following formula:

$M^1M^2O_3 (ZnO)_m$, wherein $M^1$ is at least one selected from the group consisting of Ga, Fe, Sc, In, Lu, Yb, Tm, Er, Ho and Y, $M^2$ is at least one selected from the group consisting of Mn, Fe, Ga, In and Al, and m is a natural number of 1 or more, and wherein said thin film has a natural-superlattice homologous single-crystal structure.

3. A natural-superlattice homologous single-crystal thin film comprising a complex oxide which is epitaxially grown on a ZnO single crystal, said complex oxide being expressed by the following formula:

$M^1M^2O_3 (ZnO)_m$, wherein $M^1$ is at least one selected from the group consisting of Ga, Fe, Sc, In, Lu, Yb, Tm, Er, Ho and Y, $M^2$ is at least one selected from the group consisting of Mn, Fe, Ga, In and Al, and m is a natural number of 1 or more, and wherein said thin film has natural-superlattice homologous single-crystal structure.

4. The homologous single-crystal thin film as defined in either one of claims 1 to 3, wherein the difference of said m in the thickness direction of said thin film is±1 or less.

5. The homologous single-crystal thin film as defined in either one of claims 1 to 3, wherein said m is continuously changed in the thickness direction of said thin film.

6. The homologous single-crystal thin film as defined in either one of claims 1 to 3, which includes a surface region which has atomic level smoothness and an area of 0.5 μm×0.5 μm.

7. A method of producing a natural-superlattice homologous single-crystal thin film, comprising:

depositing an epitaxially grown complex oxide thin film on either one of a ZnO single crystal and a ZnO epitaxial thin film, said complex oxide being expressed by the formula $M^1M^2O_3(ZnO)_n$ (wherein: $M^1$ is at least one selected from the group consisting of Ga, Fe, Sc, In, Lu, Yb, Tm, Er, Ho and Y; $M^2$ is at least one selected from the group consisting of Mn, Fe, Ga, In and Al; and n is a natural number of 1 or more), and subjecting said deposited film to a thermal anneal treatment, wherein said thin film has a natural-superlattice homologous single-crystal structure.

8. The method as defined in claim 7, wherein said thermal anneal treatment is performed while covering said deposited film with a high-melting-point compound plate to prevent the vaporization of ZnO from said deposited film.

9. The method as defined in claim 7, wherein said thermal anneal treatment is performed under the presence of ZnO vapor to prevent the vaporization of ZnO from said deposited film.

10. An optical, X-ray optical or electronic device comprising the homologous single-crystal thin film as defined in either one of claims 1 to 3.

11. A transparent-thin-film field-effect transistor comprising an active layer consisting of the homologous single-crystal thin film as defined in either one of claims 1 to 3, wherein said $M^1M^2O_3 (ZnO)_m$ is $InMO_3 (ZnO)_m$, wherein M is at least one selected from the group consisting of In, Fe, Ga and Al, and m is an integer in the range of 1 to less than 50.

12. The transparent-thin-film field-effect transistor as defined in claim 11, wherein said homologous single-crystal thin film is formed on a heat-resistant transparent oxide single-crystal substrate.

* * * * *